United States Patent
Onishi et al.

(10) Patent No.: US 9,252,711 B2
(45) Date of Patent: Feb. 2, 2016

(54) OSCILLATOR AND ELECTRONIC DEVICE

(75) Inventors: Yasuharu Onishi, Kanagawa (JP); Jun Kuroda, Kanagawa (JP); Motoyoshi Komoda, Kanagawa (JP); Yuichiro Kishinami, Kanagawa (JP); Shigeo Satou, Kanagawa (JP); Yukio Murata, Kanagawa (JP); Nobuhiro Kawashima, Kanagawa (JP); Tatsuya Uchikawa, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/008,383

(22) PCT Filed: Mar. 8, 2012

(86) PCT No.: PCT/JP2012/001603
§ 371 (c)(1),
(2), (4) Date: Sep. 27, 2013

(87) PCT Pub. No.: WO2012/132261
PCT Pub. Date: Oct. 4, 2012

(65) Prior Publication Data
US 2014/0015617 A1  Jan. 16, 2014

(30) Foreign Application Priority Data

Mar. 31, 2011 (JP) .................. 2011-081025

(51) Int. Cl.
*H04R 17/00* (2006.01)
*H03B 28/00* (2006.01)

(52) U.S. Cl.
CPC ............. *H03B 28/00* (2013.01); *H04R 17/00* (2013.01); *H04R 2217/03* (2013.01); *H04R 2499/11* (2013.01)

(58) Field of Classification Search
CPC ....... H01L 41/00; H01L 41/047; H04R 17/00
USPC ............ 331/2, 46, 48, 49, 107 R, 116 R, 154, 331/155; 310/313 R, 348
See application file for complete search history.

(56) References Cited

U.S. PATENT DOCUMENTS 3,878,477 A * 4/1975 Dias et al. ................... 331/40
4,281,550 A   8/1981 Erikson
(Continued)

FOREIGN PATENT DOCUMENTS

JP   62-10594 U    1/1987
JP   62-148000 U   9/1987
(Continued)

OTHER PUBLICATIONS

Communication dated Aug. 21, 2014 from the European Patent Office in counterpart application No. 12763576.1.
(Continued)

*Primary Examiner* — Jeffrey Shin
(74) *Attorney, Agent, or Firm* — Sughrue Mion, PLLC

(57) ABSTRACT

Provided is an oscillator (100) including a piezoelectric body (70) that has a plurality of protrusions (72) on one surface thereof, a plurality of electrodes (80) that are respectively provided on the plurality of protrusions (72) so as to be separated from each other, and a plurality of electrodes (82) that are provided on the other surface opposite to the one surface of the piezoelectric body (70) so that each of the electrodes faces only one electrode (80). Thus, it is possible to prevent variation in acoustic characteristics from occurring. Therefore, the oscillator capable of improving the acoustic characteristics of an electronic device is provided.

6 Claims, 6 Drawing Sheets

(56) References Cited

U.S. PATENT DOCUMENTS

| | | | |
|---|---|---|---|
| 4,550,606 A | 11/1985 | Drost | |
| 4,692,654 A * | 9/1987 | Umemura et al. | 310/334 |
| 4,870,867 A | 10/1989 | Shaulov | |
| 7,564,316 B2 * | 7/2009 | Frank | 331/107 A |
| 2006/0090328 A1 * | 5/2006 | Kawashima | 29/594 |
| 2006/0175934 A1 | 8/2006 | Or et al. | |
| 2007/0266792 A1 | 11/2007 | Oosawa | |
| 2008/0098816 A1 | 5/2008 | Yamashita et al. | |
| 2009/0096326 A1 * | 4/2009 | Onishi et al. | 310/334 |

FOREIGN PATENT DOCUMENTS

| | | | |
|---|---|---|---|
| JP | 04-111599 A | 4/1992 | |
| JP | 05-041899 A | 2/1993 | |
| JP | 05-075372 A | 3/1993 | |
| JP | 07-163166 A | 6/1995 | |
| JP | 09-084193 A | 3/1997 | |
| JP | 2003169118 A | 6/2003 | |
| JP | 2004-349817 A | 12/2004 | |
| JP | 2005-286690 A | 10/2005 | |
| JP | 2006-332616 A | 12/2006 | |
| JP | 2007-307288 A | 11/2007 | |
| JP | 2008-118212 A | 5/2008 | |
| WO | 2005053357 A1 | 6/2005 | |
| WO | 2005/094121 A1 | 10/2005 | |

OTHER PUBLICATIONS

Communication dated May 7, 2015, issued by the European Patent Office in corresponding European Application No. 15155345.0.

* cited by examiner (a)

(b)

(c)

(d)

OSCILLATOR AND ELECTRONIC DEVICE

CROSS REFERENCE TO RELATED APPLICATIONS

This application is a National Stage of International Application No. PCT/JP2012/001603 filed Mar. 8, 2012, claiming priority based on Japanese Patent Application No. 2011-081025 filed Mar. 31, 2011, the contents of all of which are incorporated herein by reference in their entirety.

TECHNICAL FIELD

The present invention relates to an oscillator having a piezoelectric vibrator, and an electronic device.

BACKGROUND ART

As an electro-acoustic transducer installed in an electronic device, there is a piezoelectric electro-acoustic transducer. The piezoelectric electro-acoustic transducer generates a vibrational amplitude by using an expansion and contraction motion that occurs by applying an electric field to a piezoelectric vibrator. Since the piezoelectric electro-acoustic transducer does not require a large number of members in order to generate the vibrational amplitude, there is an advantage in a reduction in the thickness thereof.

A technique involved in the piezoelectric electro-acoustic transducer is disclosed in, for example, Patent Document 1 and Patent Document 2. In the technique disclosed in Patent Document 1, a piezoelectric element and a vibrating film are bonded to each other through a vibration transfer member having elasticity. In the technique disclosed in Patent Document 2, piezoelectric bodies separated from each other are provided on a supporter.

A technique involved in a piezoelectric element is also disclosed in, for example, Patent Documents 3 to 8. Patent Documents 3 and 4 disclose a technique regarding an ultrasound wave probe using a piezoelectric element. In a technique disclosed in Patent Document 5, a damper member is buried in a groove that is formed in a piezoelectric ceramic element. Patent Document 6 discloses a technique relating to a piezoelectric actuator, in which a protruding portion is formed coming in contact with an elastic member and a moving element. In a technique disclosed in Patent Document 7, vibrating electrodes provided on two principal surfaces of a piezoelectric element are pressed for electrical conduction therebetween without applying a conductive paste thereto. In addition, Patent Document 8 discloses a method of manufacturing a piezoelectric actuator.

RELATED DOCUMENT

Patent Document

[Patent Document 1] Pamphlet of International Publication WO. 2005/094121
[Patent Document 2] Japanese Unexamined Utility Model Registration Publication No. S62-10594
[Patent Document 3] Japanese Unexamined Patent Publication No. H5-41899
[Patent Document 4] Japanese Unexamined Patent Publication No. H9-84193
[Patent Document 5] Japanese Unexamined Utility Model Registration Publication No. S62-148000
[Patent Document 6] Japanese Unexamined Patent Publication No. H7-163166
[Patent Document 7] Japanese Unexamined Patent Publication No. H5-75372
[Patent Document 8] Japanese Unexamined Patent Publication No. 2006-332616

DISCLOSURE OF THE INVENTION

For example, the piezoelectric electro-acoustic transducer is configured by arranging a plurality of oscillators each having a piezoelectric vibrator in an array. In this case, variation in characteristics occurs between a plurality of the piezoelectric vibrators. Thus, acoustic characteristics of the electronic device deteriorate. Therefore, there is a demand for a reduction in the variation in characteristics between the piezoelectric vibrators in order to improve the acoustic characteristics of the electronic device.

In addition, in order to improve the acoustic characteristics of the electronic device, it is preferable to improve a sound pressure level of an oscillator included in the electronic device.

An object of the invention is to improve the acoustic characteristics of an electronic device.

According to a first invention, provided is an oscillator comprising: a piezoelectric body that has a plurality of first protrusions on one surface thereof; a plurality of first electrode layers that are respectively provided on the plurality of first protrusions so as to be separated from each other; and a plurality of second electrode layers that are provided on the other surface opposite to the one surface of the piezoelectric body so that each of the second electrode layers faces only one first electrode layer.

According to a second invention, provided is an oscillator comprising: a piezoelectric vibrator; a vibration member that constrains the piezoelectric vibrator on one surface thereof, and of which the end is bent toward one surface side or the other surface side opposite to the one surface; and a supporting member that holds the end of the vibration member.

In addition, according to the second invention, provided is an electronic device comprising: a supporting member; and a plurality of oscillators that are fixed onto the supporting member, wherein the oscillator includes: a piezoelectric vibrator; and a vibration member that constrains the piezoelectric vibrator on one surface thereof, and of which the end is bent toward one surface side or the other surface side opposite to the one surface and is held by the supporting member.

According to the invention, it is possible to improve acoustic characteristics of an electronic device.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Figure 1:
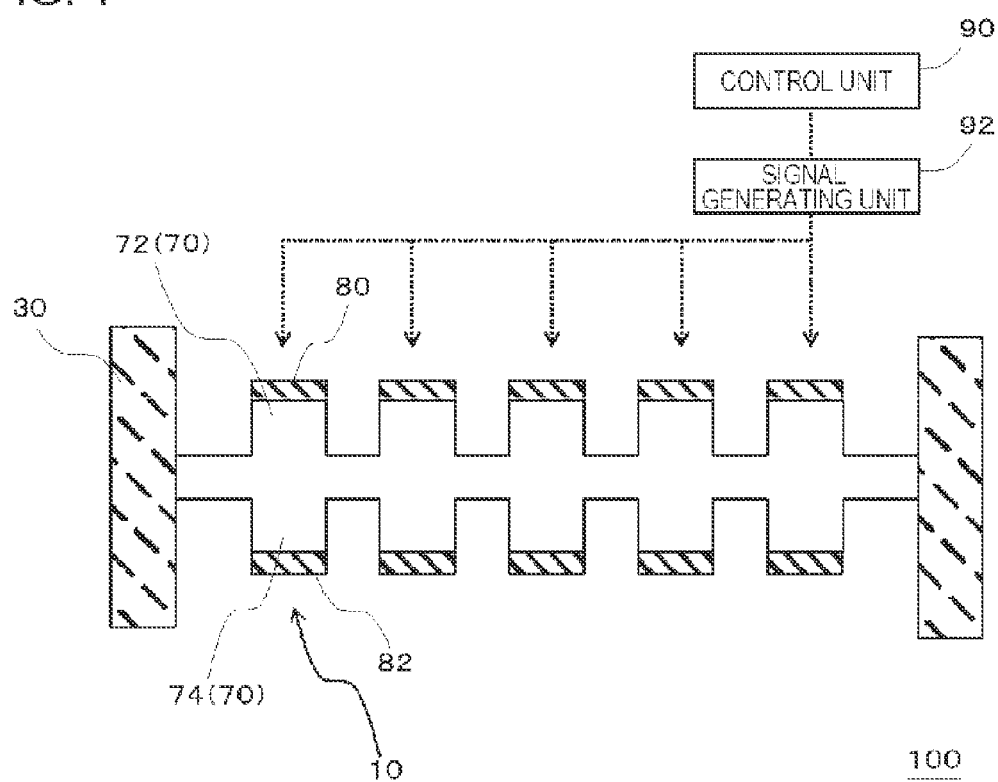
FIG. 1 is a cross-sectional view illustrating an oscillator according to a first embodiment.

Hereinafter, embodiments of the invention will be described with reference to the accompanying drawings. In all the drawings, like elements are referenced by like reference numerals and descriptions thereof will not be repeated.

FIG. 1 is a cross-sectional view illustrating an oscillator 100 according to a first embodiment. The oscillator 100 according to the embodiment corresponds to the first invention in the specification. The oscillator 100 according to the embodiment comprises a piezoelectric body 70, a plurality of upper electrodes 80, and a plurality of lower electrodes 82. For example, the oscillator 100 is installed in an electronic device such as a cellular phone.

The piezoelectric body 70 has a plurality of protrusions 72 on one surface thereof. The plurality of upper electrodes 80 are provided on the plurality of protrusions 72, respectively, so as to be separated from each other. The plurality of lower electrodes 82 are provided on the other surface opposite to the one surface of the piezoelectric body 70 so that each of the lower electrodes faces only one upper electrode 80. Hereinafter, the configuration of the oscillator 100 will be described in detail.

Figure 2:
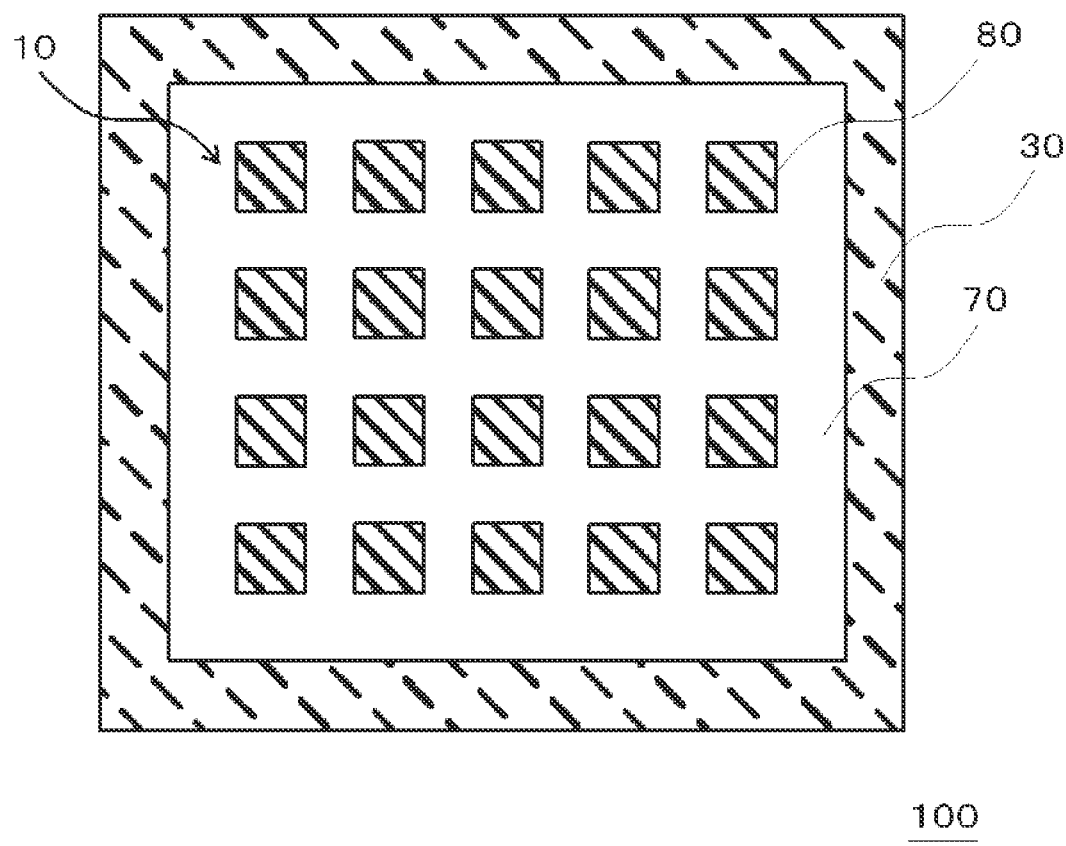
FIG. 2 is a plan view illustrating the oscillator shown in FIG. 1.

FIG. 2 is a plan view illustrating the oscillator 100 shown in FIG. 1. FIG. 2 illustrates a top surface of the oscillator 100. As illustrated in FIG. 2, the protrusions 72 and the upper electrodes 80 that are respectively provided on the protrusions 72 are arranged, for example, in an array.

As illustrated in FIG. 1, for example, the piezoelectric body 70 has a plurality of protrusions 74 on the other surface thereof. The plurality of protrusions 74 are provided on the other surface of the piezoelectric body 70 so that each of the protrusions 74 overlaps only one protrusion 72 when seen in a plan view. In the embodiment, the plurality of protrusions 72 and the plurality of protrusions 74 can be provided so as to be plane-symmetrical to each other based on a central surface that is located between the one surface and the other surface of the piezoelectric body 70 (not shown).

The piezoelectric body 70 is constituted by a material having a piezoelectric effect, for example, lead zirconate titanate (PZT) or barium titanate ($BaTiO_3$), as a material having a high electro-mechanical conversion efficiency.

The protrusion 72 and the protrusion 74 are formed by processing the piezoelectric body formed of the above-described material having a piezoelectric effect. The processing of the piezoelectric body can be performed through, for example, cutting work of a piezoelectric material or baking using a shape mold.

The protrusion 72 and the protrusion 74 have, for example, a square shape when seen in a plan view.

The piezoelectric body 70 is polarized in the thickness direction thereof (vertical direction in FIG. 1). It is preferable that the piezoelectric body 70 have a thickness of equal to or less than 1 mm in a portion where the protrusion 72 and the protrusion 74 overlap each other when seen in a plan view. When the thickness exceeds 1 mm, the electric field intensity of the piezoelectric body 70 decreases, which results in a decrease in energy conversion efficiency. In addition, it is preferable that the piezoelectric body 70 have a thickness of equal to or more than 10 µm in a portion where the protrusion 72 and the protrusion 74 are not located. When the thickness is less than 10 µm, there is a concern that the piezoelectric body may be damaged during handling because the piezoelectric body 70 is constituted by a brittle material.

For example, the upper electrode 80 can be provided so as to have the same shape as the protrusion 72 when seen in a plan view. In addition, for example, the lower electrode 82 can be provided so as to have the same shape as the protrusion 74 when seen in a plan view.

The upper electrode 80 and the lower electrode 82 are constituted by a material having an electrical conduction property, for example, silver or a silver/palladium alloy. Since silver is a low-resistance versatile material, there is an advantage from the viewpoint of a manufacturing cost and a manufacturing process. In addition, a silver/palladium alloy is a low-resistance material having an excellent oxidation resistance and has an excellent reliability. The thicknesses of the upper electrode 80 and the lower electrode 82 are preferably 1 µm to 50 µm. When the thicknesses are less than 1 µm, it is difficult to uniformly mold the upper electrode 80 and the lower electrode 82. On the other hand, when the thicknesses exceed 50 µm, the upper electrode 80 or the lower electrode 82 serves as a constraint surface with respect to the piezoelectric body 70, which results in a decrease in the energy conversion efficiency.

The upper electrode 80 and the lower electrode 82 that face each other, respectively, and the piezoelectric body 70 located between the upper electrode 80 and the lower electrode 82 constitute one piezoelectric vibrator 10. In other words, one piezoelectric vibrator 10 is constituted by the upper electrodes 80 and the lower electrodes 82 facing each other, respectively, and the protrusions 72 and the protrusions 74 that are located between the upper electrodes 80 and the lower electrodes 82.

Thus, the oscillator 100 has a plurality of the piezoelectric vibrators 10.

Figure 3:
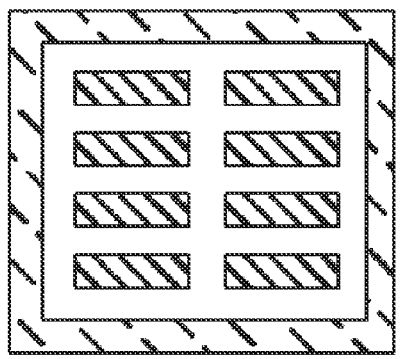
FIG. 3 is a plan view illustrating a modified example of the oscillator shown in FIG. 1.
Figure 3:
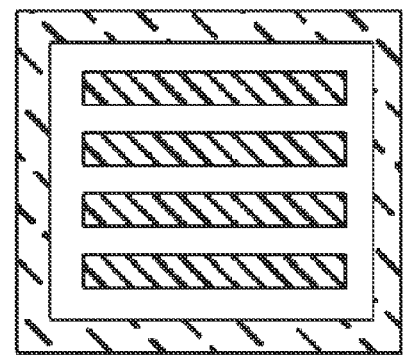
Figure 3:
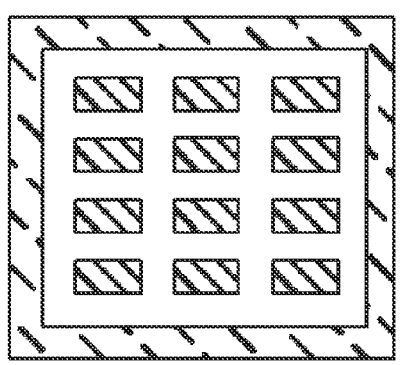
Figure 3:
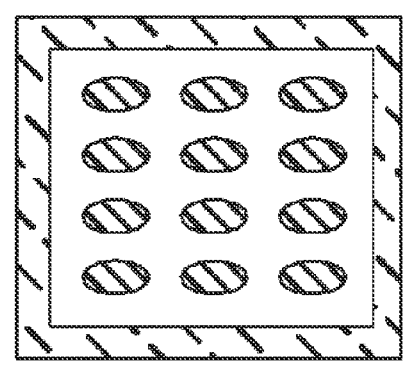

FIG. 3 is a plan view illustrating a modified example of the oscillator 100 shown in FIG. 1. In the embodiment, the protrusion 72, the protrusion 74, the upper electrode 80, and the lower electrode 82 have a square shape when seen in a plan view. On the other hand, as illustrated in FIG. 3, the protrusion 72, the protrusion 74, the upper electrode 80, and the lower electrode 82 can have any of various shapes. For example, as illustrated in FIGS. 3(a), 3(b), and 3(c), the protrusion 72, the protrusion 74, the upper electrode 80, and the lower electrode 82 can be provided so as to have an oblong shape. In addition, the number of arrangements thereof is not limited. Further, as illustrated in FIG. 3(d), for example, the protrusion 72, the protrusion 74, the upper electrode 80, and the lower electrode 82 may be provided so as to have a circular shape or an elliptical shape when seen in a plan view.

In this manner, the shapes of the protrusion 72, the protrusion 74, the upper electrode 80, and the lower electrode 82 are selected, thereby allowing resonance frequencies of the plurality of piezoelectric vibrators 10 constituted by these to be selected.

In the plurality of piezoelectric vibrators 10 constituted by the protrusions 72, the protrusions 74, the upper electrodes 80, and the lower electrodes 82, it is possible to set any interval between the piezoelectric vibrators 10 adjacent to each other. Thus, it is possible to prevent a sound wave from interfering between the plurality of piezoelectric vibrators 10.

As illustrated in FIGS. 1 and 2, for example, the oscillator 100 includes a supporting frame 30 that holds the piezoelectric body 70. For example, the supporting frame 30 holds an edge of the piezoelectric body 70. In addition, for example, the supporting frame 30 holds the entire circumference of the piezoelectric body 70.

As illustrated in FIG. 1, the oscillator 100 includes a control unit 90 and a signal generating unit 92.

The signal generating unit 92 is connected to each of the upper electrodes 80 and each of the lower electrodes 82. The signal generating unit 92 generates an electrical signal to be input to each piezoelectric vibrator 10 that is constituted by each upper electrode 80 and each lower electrode 82.

The control unit 90 is connected to the signal generating unit 92, and controls the generation of a signal by the signal generating unit 92. The control unit 90 controls the generation of the signal by the signal generating unit 92 based on information that is input from the outside, and thus the control unit 90 can independently control the output of the plurality of piezoelectric vibrators 10.

When the oscillator 100 is used as a parametric speaker, the control unit 90 inputs a modulated signal of the parametric speaker through the signal generating unit 92. In this case, each piezoelectric vibrator 10 uses a sound wave of equal to or more than 20 kHz, for example, 100 kHz, as a carrier wave of the signal.

A fundamental resonance frequency of the piezoelectric vibrator depends on a length of a contour shape of a vibration plane. In other words, as a resonance frequency shifts to a high frequency, the area of the piezoelectric vibrator is reduced. For this reason, the oscillation frequency of each piezoelectric vibrator 10 is set to be in an ultrasound wave band, thereby allowing the size of the oscillator 100 to be reduced.

In addition, the oscillation frequency of each piezoelectric vibrator 10 is set to be in an ultrasound wave band, and thus a high directivity can be realized.

In addition, when the oscillator 100 is used as a general speaker, the control unit 90 may directly input a sound signal to each piezoelectric vibrator 10 through the signal generating unit 92.

In addition, when the oscillator 100 is used as a sound wave sensor, a signal to be input to the control unit 90 is a command signal to the effect that a sound wave is oscillated. When the oscillator 100 is used as a sound wave sensor, the signal generating unit 92 causes each piezoelectric vibrator 10 to generate a sound wave having a resonance frequency of each piezoelectric vibrator 10.

Next, effects of the embodiment will be described. The oscillator 100 according to the embodiment comprises the plurality of upper electrodes 80 that are respectively provided on the plurality of protrusions 72 included in the piezoelectric body 70 so as to be separated from each other, and the plurality of lower electrodes 82 that are provided on the other surface of the piezoelectric body 70 so that each of the lower electrodes faces only one upper electrode 80. At this time, the plurality of protrusions 72, the plurality of upper electrodes 80, and the plurality of lower electrodes 82 constitute the plurality of piezoelectric vibrators 10.

As such, according to the embodiment, the plurality of piezoelectric vibrators 10 are constituted by the single-layered piezoelectric body 70. For this reason, the plurality of piezoelectric vibrators 10 are arranged in an array, and thus a process of bonding them to each other is not required. It is possible to prevent variation in characteristics from occurring between the plurality of piezoelectric vibrators 10. Therefore, it is possible to improve the acoustic characteristics of the electronic device.

In addition, each piezoelectric vibrator 10 is independently controlled through each upper electrode 80 and each lower electrode 82. Thus, it is possible to control the plurality of piezoelectric vibrators 10 with a high degree of freedom.

Each of the plurality of piezoelectric vibrators 10 is constituted by each protrusion 72. In other words, the plurality of piezoelectric vibrators 10 are arranged by interposing grooves therebetween. Thus, as compared with a case where no groove is formed between the piezoelectric vibrators 10, the vibration of the piezoelectric vibrator 10 is prevented from being constrained. Therefore, the energy loss of the oscillator 100 is reduced, and thus power consumption can be reduced.

In addition, the plurality of protrusions 72 are arranged by interposing grooves therebetween. Thus, it is possible to prevent the vibration from being transferred from one piezoelectric vibrator 10 to another adjacent piezoelectric vibrator 10.

Figure 4:
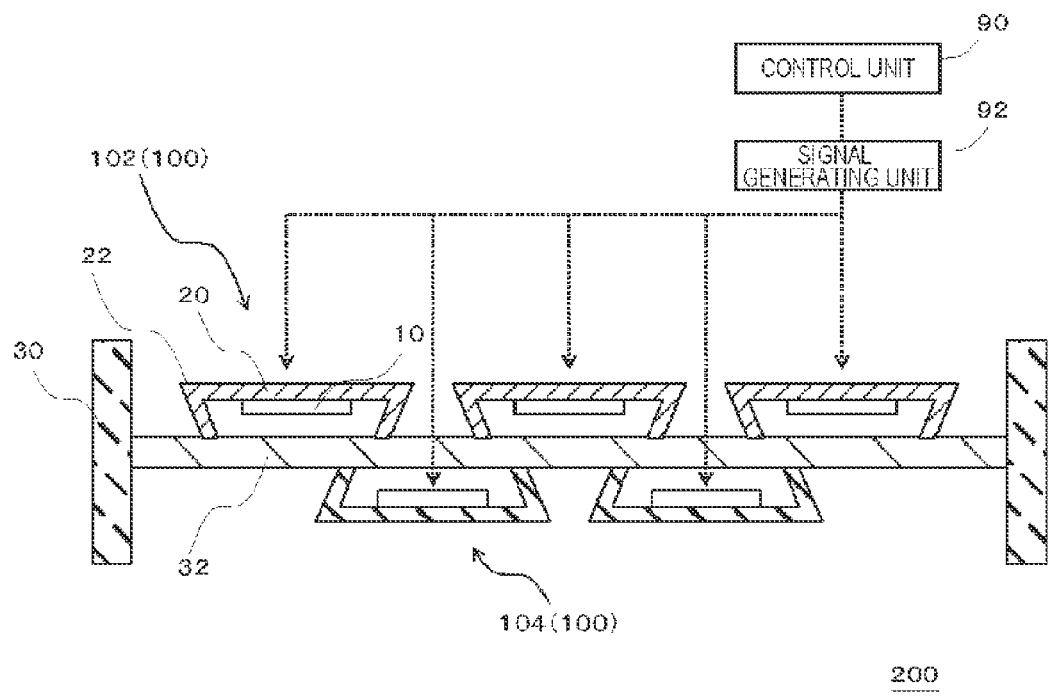
FIG. 4 is a cross-sectional view illustrating an electronic device according to a second embodiment.
Figure 5:
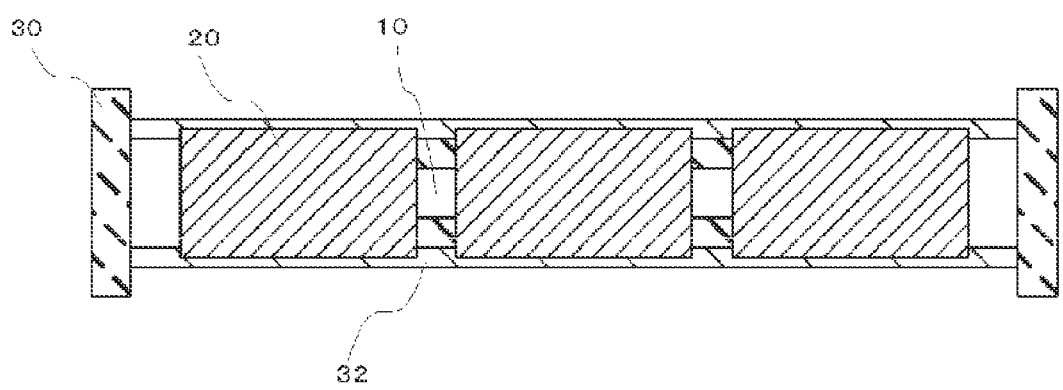
FIG. 5 is a plan view illustrating the electronic device shown in FIG. 4.

FIG. 4 is a cross-sectional view illustrating an electronic device 200 according to a second embodiment. In addition, FIG. 5 is a plan view illustrating the electronic device 200 shown in FIG. 4. The electronic device 200 according to the embodiment corresponds to the second invention in the specification. The electronic device 200 according to the embodiment comprises a supporting member and a plurality of the oscillators 100. For example, the electronic device 200 is a portable terminal device such as a cellular phone.

The plurality of oscillators 100 are fixed onto the supporting member. The oscillator 100 has the piezoelectric vibrator 10 and a vibration member 20. The vibration member 20 constrains the piezoelectric vibrator 10 on one surface thereof. In addition, the end of the vibration member 20 is bent toward one surface side or the other surface side opposite to the one surface. Further, the end of the vibration member 20 is held by the supporting member. Hereinafter, the configuration of the electronic device 200 will be described in detail.

The vibration member 20 has, for example, a flat plate shape. The vibration member 20 is constituted by a material, such as a metal or a resin, having a high elastic modulus with respect to ceramic which is a brittle material, and is constituted by a versatile material such as phosphor bronze or stainless steel. The thickness of the vibration member 20 is preferably 5 µm to 500 µm. In addition, the modulus of longitudinal elasticity of the vibration member 20 is preferably 1 GPa to 500 GPa. When the modulus of longitudinal elasticity of the vibration member 20 is excessively low or high, there is a concern that vibration characteristics and reliability of the oscillator may be damaged.

As illustrated in FIG. 4, the vibration member 20 is held by, for example, a substrate 32. As illustrated in FIG. 5, the substrate 32 has a hollow ring shape. The ring shape is, for example, quadrangular. However, the invention is not limited thereto, and the ring shape may be circular or elliptical. A portion of the end of the vibration member 20 is fixed onto the substrate 32, and thus the vibration member 20 is held by the substrate 32.

In addition, the substrate 32 is fixed using, for example, the supporting frame 30.

As illustrated in FIG. 4, the end of the vibration member 20 is bent toward the one surface side. Since the end of the vibration member 20 is bent, the vibration member 20 has a spring shape. Thus, during vibration, a flat spring effect acts on the vibration member 20. In addition, it is possible to increase the length of a stroke during the vibration. Therefore, a sound pressure level of the oscillator 100 can be improved.

As illustrated in FIG. 4, the vibration member 20 is bent toward one of one surface side and the other surface side at one end thereof and at the other end opposite to the one end. In the embodiment, as illustrated in FIG. 4, both the one end and the other end of the vibration member 20 are bent toward the one surface side. In addition, the vibration member 20 is fixed to the substrate 32 at the one end and the other end thereof.

The vibration member 20 is bent at a bend portion 22. In addition, when seen in a plan view, the end of the vibration member 20 is located further inside than the bend portion 22. For this reason, a mounting area for the bent end of the vibration member 20 is not required. Therefore, it is possible to reduce a distance between the arranged oscillators 100 and to reduce the size of the electronic device 200.

As illustrated in FIG. 4, for example, the plurality of oscillators 100 are arranged on both surfaces of the substrate 32. In the embodiment, a plurality of oscillators 102 are arranged on one surface of the substrate 32, and a plurality of oscillators 104 are arranged on the other surface thereof. In addition, the oscillators 102 and the oscillators 104 are disposed so as to be mutually displaced when seen in a plan view.

According to the electronic device 200 in the embodiment, the oscillators 102 and the oscillators 104 are disposed so as to be mutually displaced when seen in a plan view. In addition, the substrate 32 has a hollow ring shape.

For this reason, a sound wave that is output toward one surface side of the substrate 32 from the plurality of oscillators 102 and a sound wave that is output toward one surface side of the substrate 32 from the plurality of oscillators 104 via gaps between the oscillators 102 are emitted toward one surface side of the substrate 32. In addition, a sound wave that is output toward the other surface side of the substrate 32 from the plurality of oscillators 104 and a sound wave that is output toward the other surface side of the substrate 32 from the plurality of oscillators 102 via gaps between the oscillators 104 are emitted toward the other surface side of the substrate 32.

Therefore, the sound waves that are output from the oscillators 102 and the oscillators 104 are effectively emitted, and thus a high sound pressure level can be realized.

Meanwhile, the arrangement of the oscillators 102 and the oscillators 104 can be arbitrarily adjusted.

Figure 6:
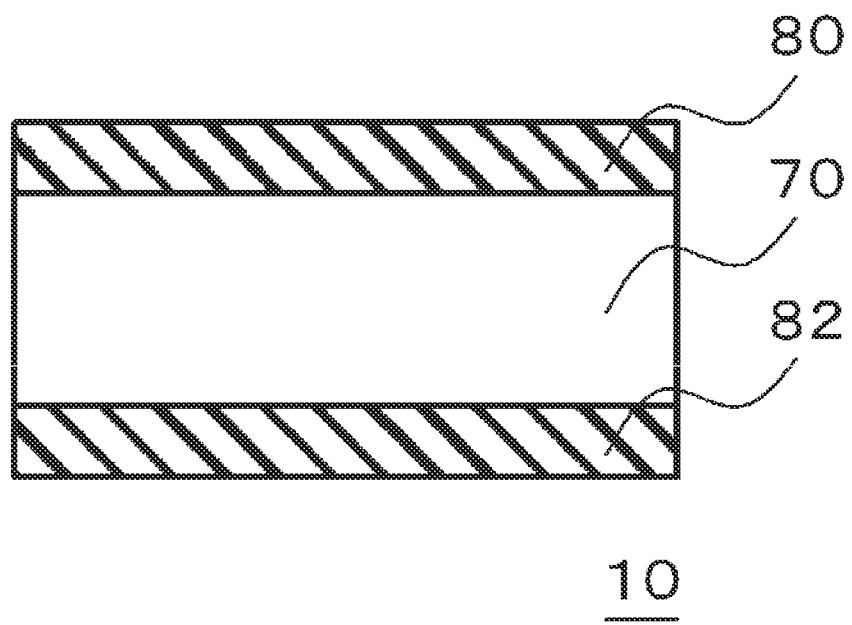
FIG. 6 is a cross-sectional view illustrating a piezoelectric vibrator shown in FIG. 4.

FIG. 6 is a cross-sectional view illustrating the piezoelectric vibrator 10 shown in FIG. 4. As illustrated in FIG. 6, the piezoelectric vibrator 10 has the piezoelectric body 70, the upper electrode 80, and the lower electrode 82. The piezoelectric body 70 is interposed between the upper electrode 80 and the lower electrode 82. In addition, the piezoelectric body 70 is polarized in the thickness direction thereof (vertical direction in FIG. 6). The piezoelectric vibrator 10 is, for example, circular or elliptical in shape in a plane direction horizontal to one surface of the vibration member 20.

For example, the same as that of the first embodiment can be used as the piezoelectric body 70. In addition, for example, the same as that of the first embodiment can be used as the upper electrode 80 and the lower electrode 82.

The electronic device 200 includes the control unit 90 and the signal generating unit 92.

The signal generating unit 92 is connected to each piezoelectric vibrator 10, and generates an electrical signal to be input to each piezoelectric vibrator 10. In addition, the control unit 90 is connected to the signal generating unit 92 and controls the generation of a signal by the signal generating unit 92. The control unit 90 controls the generation of the signal by the signal generating unit 92 based on information that is input from the outside, and thus the control unit can independently control the output of the plurality of oscillators 100.

The output control of the oscillator 100 can be implemented using the control unit 90 and the signal generating unit 92 in a similar manner to the first embodiment.

Next, effects of the embodiment will be described. The electronic device 200 according to the embodiment comprises a vibration member that constrains the piezoelectric vibrator 10 on one surface thereof, and of which the end is bent toward one surface side or the other surface side and is held by a supporting member.

According to the embodiment, the vibration member 20 has a spring shape. For this reason, during vibration, a plate spring effect acts on the vibration member 20. In addition, it is possible to increase the length of a stroke during the vibration. Thus, a sound pressure level of the oscillator 100 can be improved. Therefore, the acoustic characteristics of the electronic device can be improved.

As described above, although the embodiments of the invention have been set forth with reference to the drawings, they are merely illustrative of the invention, and various configurations other than stated above can be adopted.

The application claims priority from Japanese Patent Application No. 2011-081025 filed on Mar. 31, 2011, the content of which is incorporated herein by reference in its entirety.

The invention claimed is:

1. An oscillator comprising:
 a piezoelectric body that has a plurality of first protrusions on one surface thereof;
 a plurality of first electrodes that are respectively provided on the plurality of first protrusions so as to be separated from each other;
 a plurality of second electrodes that are provided on the other surface opposite to the one surface of the piezoelectric body so that each of the second electrodes faces only one first electrode; and
 a plurality of second protrusions that are provided on the other surface of the piezoelectric body so that each of the second protrusions overlaps only one first protrusion when seen in a plan view,
 wherein an entire periphery of each of the first protrusions is surrounded by grooves.

2. The oscillator according to claim 1, further comprising:
 a signal generating unit that is connected to each of the first electrodes and each of the second electrodes; and
 a control unit that controls generation of a signal by the signal generating unit,
 wherein the first electrode and the second electrode that face each other, and the piezoelectric body that is interposed between the first electrode and the second electrode constitute one piezoelectric vibrator, and
 wherein the control unit controls the generation of the signal by the signal generating unit to independently control the output of a plurality of the piezoelectric vibrators.

3. An oscillator comprising:
 a piezoelectric vibrator;
 a vibration member that constrains the piezoelectric vibrator on one surface thereof, and wherein at least one end of the vibration member is bent inward toward one surface side of the piezoelectric vibrator or another surface side opposite to the one surface side; and
 a supporting member that holds the end of the vibration member,
 wherein the vibration member is bent at a bend portion, and
 wherein the at least one end of the vibration member is located further inward toward the one surface side or the another surface side than the bend portion when seen in a plan view in a condition that a voltage is not applied to the piezoelectric vibrator.

4. The oscillator according to claim 3, wherein the vibration member is bent toward one of the one surface side and the other surface side at one end thereof and the other end opposite to the one end.

5. An electronic device comprising:
 a supporting member; and
 a plurality of oscillators that are fixed onto the supporting member, wherein the oscillator includes:
a piezoelectric vibrator; and
a vibration member that constrains the piezoelectric vibrator on one surface thereof, and wherein at least one end of the vibration member is bent toward one surface side of the piezoelectric vibrator or another surface side opposite to the one surface side and is held by the supporting member,
wherein the vibration member is bent at a bend portion, and
wherein the at least one end of the vibration member is located further inward toward the one surface side or the another surface side than the bend portion when seen in a plan view in condition that a voltage is not applied to the piezoelectric vibrator.

6. The electronic device according to claim 5, wherein the plurality of oscillators are arranged on both surfaces of the supporting member.

* * * * *